United States Patent
Chuang et al.

(10) Patent No.: US 10,262,706 B1
(45) Date of Patent: Apr. 16, 2019

(54) ANTI-FLOATING CIRCUIT

(71) Applicant: Vanguard International Semiconductor Corporation, Hsinchu (TW)

(72) Inventors: Jung-Tsun Chuang, Tainan (TW); Shao-Chang Huang, Hsinchu (TW); Ching-Wen Chen, Taichung (TW); Chieh-Yao Chuang, Kaohsiung (TW); Yu-Yen Lin, Cyonglin Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/989,487

(22) Filed: May 25, 2018

(51) Int. Cl.
| | | |
|---|---|---|
| *G11C 7/24* | (2006.01) | |
| *H03K 3/037* | (2006.01) | |
| *H03K 5/134* | (2014.01) | |
| *H02H 7/20* | (2006.01) | |
| *H03K 19/20* | (2006.01) | |
| *H03K 5/00* | (2006.01) | |

(52) U.S. Cl.
CPC ............. *G11C 7/24* (2013.01); *H02H 7/20* (2013.01); *H03K 3/037* (2013.01); *H03K 5/134* (2014.07); *H03K 19/20* (2013.01); *H03K 2005/00058* (2013.01); *H03K 2005/00195* (2013.01)

(58) Field of Classification Search
CPC ....... G11C 11/419; G11C 16/08; G11C 16/12; G11C 7/1057; G11C 7/1069; G11C 7/1084; G11C 7/1096; G11C 8/08; G11C 8/10
See application file for complete search history.

(56) References Cited

U.S. PATENT DOCUMENTS

| | | | | | |
|---|---|---|---|---|---|
| 5,444,408 | A | * | 8/1995 | Merritt ...................... | G05F 3/24 326/62 |
| 5,952,847 | A | * | 9/1999 | Plants ............. | H03K 19/018521 326/58 |
| 7,196,547 | B2 | * | 3/2007 | Kozawa ........... | H03K 3/356113 326/68 |
| 7,446,566 | B1 | * | 11/2008 | Chrudimsky .......... | H03K 3/012 326/68 |
| 7,733,126 | B1 | * | 6/2010 | Choy .............. | H03K 19/018521 326/68 |
| 7,755,392 | B1 | * | 7/2010 | Ku .................... | H03K 3/356113 326/68 |

(Continued)

*Primary Examiner* — Adam D Houston
(74) *Attorney, Agent, or Firm* — Birch, Stewart, Kolasch & Birch, LLP

(57) ABSTRACT

An anti-floating circuit including a first pull-high circuit, a first pull-low circuit and a first control circuit is provided. The first pull-high circuit includes a first P-type transistor and a second P-type transistor and is coupled to a first power terminal. The first pull-low circuit includes a first N-type transistor and a second N-type transistor and is coupled to a second power terminal. A first path is between the first P-type transistor and the first N-type transistor. A second path is between the second P-type transistor and the second N-type transistor. A third path is between the first P-type transistor and the second power terminal. In the first mode, the control circuit turns on the first and second paths and turns off the third path. In the second mode, the control circuit turns off the first and second paths and turns on the third path.

20 Claims, 8 Drawing Sheets

(56) References Cited

U.S. PATENT DOCUMENTS

| | | | |
|---|---|---|---|
| 7,834,662 B2* | 11/2010 | Campbell | H03K 3/35613 326/68 |
| 7,915,920 B2* | 3/2011 | Campbell | H03K 3/012 326/63 |
| 7,994,821 B1* | 8/2011 | Wang | H03K 3/356069 326/68 |
| 8,102,728 B2* | 1/2012 | Campbell | G11C 7/12 365/154 |
| 8,319,540 B2* | 11/2012 | Barrow | H03K 3/356165 327/333 |
| 8,384,431 B2* | 2/2013 | Barrow | H03K 3/35613 326/68 |
| 8,406,068 B2* | 3/2013 | Castaldo | H03K 19/018528 365/189.11 |
| 8,575,962 B2* | 11/2013 | Yang | H03K 3/356156 326/80 |
| 8,587,359 B2* | 11/2013 | Saether | H03K 19/018521 327/333 |
| 8,604,868 B2* | 12/2013 | Ucciardello | H03K 17/102 327/333 |
| 9,191,007 B1* | 11/2015 | Choy | H03K 3/356113 |
| 9,595,967 B2* | 3/2017 | Goto | H03K 19/018514 |
| 9,768,779 B2* | 9/2017 | Nadkarni | H03K 19/018521 |
| 10,115,450 B1* | 10/2018 | DeBrosse | G11C 11/4082 |
| 2002/0097606 A1* | 7/2002 | Kurokawa | G11C 16/12 365/185.18 |
| 2003/0179032 A1* | 9/2003 | Kaneko | H03K 19/09429 327/333 |
| 2007/0070780 A1* | 3/2007 | Park | G11C 7/1051 365/230.06 |
| 2008/0238522 A1* | 10/2008 | Thorp | H03K 3/356182 327/333 |
| 2008/0238523 A1* | 10/2008 | Thorp | H03K 3/35613 327/333 |
| 2009/0096484 A1* | 4/2009 | Jao | H03K 3/356113 326/68 |
| 2013/0250704 A1* | 9/2013 | Furutani | H03K 19/0013 365/189.11 |
| 2014/0145777 A1* | 5/2014 | Ma | H03K 3/356165 327/333 |
| 2014/0197872 A1* | 7/2014 | Alessandro | H03K 3/35613 327/333 |
| 2014/0266384 A1* | 9/2014 | Lan | H03K 3/356104 327/333 |
| 2014/0269112 A1* | 9/2014 | Jung | G11C 7/12 365/189.11 |
| 2015/0365085 A1* | 12/2015 | Qing | H03K 17/302 345/100 |
| 2016/0042794 A1* | 2/2016 | Chang | G11C 16/08 365/185.23 |
| 2016/0118985 A1* | 4/2016 | Zhou | H03K 3/356165 326/80 |
| 2016/0118987 A1* | 4/2016 | Ho | H03K 19/018585 326/68 |
| 2016/0329887 A1* | 11/2016 | Kwon | H03K 19/0185 |
| 2017/0193885 A1* | 7/2017 | Feng | G11C 19/28 |
| 2017/0364170 A1* | 12/2017 | Gu | G02F 1/1362 |
| 2018/0090924 A1 | 3/2018 | Djelassi et al. | |
| 2018/0191347 A1* | 7/2018 | Bonetti | H03K 19/21 |

* cited by examiner

US 10,262,706 B1

ANTI-FLOATING CIRCUIT

BACKGROUND OF THE INVENTION

Field of the Invention

The invention relates to an anti-floating circuit, and more particularly to an anti-floating circuit which comprises a pull-high circuit and a pull-low circuit.

Description of the Related Art

With the development of technology, the size of integrated circuits has been greatly reduced. Generally, each integrated circuit operates according to at least one input signal. However, when the input signal is not the correct signal, a false action may be caused in the integrated circuit.

BRIEF SUMMARY OF THE INVENTION

An anti-floating circuit generates a first output signal according to a first input signal in a first mode and sets the first output signal to a first predetermined value in a second mode. The anti-floating circuit comprises a first pull-high circuit, a first pull-low circuit and a first control circuit. The first pull-high circuit comprises a first P-type transistor and a second P-type transistor. The first P-type transistor comprises a source coupled to a first power terminal and a drain outputting the first output signal. The second P-type transistor comprises a source coupled to the first power terminal, a drain coupled to a gate of the first P-type transistor and a gate coupled to the drain of the first P-type transistor. The first pull-low circuit comprises a first N-type transistor and a second N-type transistor. The first N-type transistor comprises a gate receiving a first inverted signal and a source coupled to a second power terminal. The second N-type transistor comprises a gate receiving the first input signal and a source coupled to the second power terminal. The first control circuit is coupled between the first pull-high circuit and the first pull-low circuit. In the first mode, the first control circuit turns on a first path between the first P-type transistor and the first N-type transistor and a second path between the second P-type transistor and the second N-type transistor and turns off a third path between the first P-type transistor and the second power terminal. In the second mode, the first control circuit turns off the first and second paths and turns on the third path.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1A:
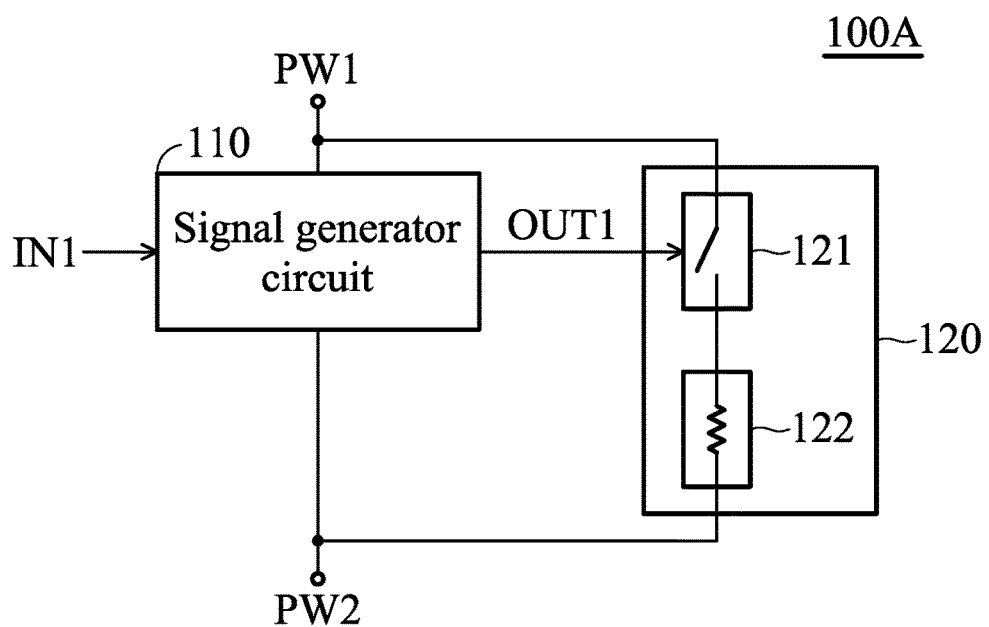
FIG. 1A is a schematic diagram of an exemplary embodiment of an anti-floating circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a schematic diagram of an exemplary embodiment of an anti-floating circuit according to various aspects of the present disclosure. The anti-floating circuit 100A comprises a signal generator circuit 110 and a core circuit 120. The signal generator circuit 110 is coupled between a power terminal PW1 and a power terminal PW2 and generates an output signal OUT1. In one embodiment, the signal generator circuit 110 is a level shifter. In this case, the signal generator circuit 110 transforms an input signal IN1 to generate the output signal OUT1.

When the input signal IN1 is at a first level, the output signal OUT1 is at a second level. When the input signal IN1 is at a third level, the output signal OUT1 is at a fourth level. In one embodiment, the second level is higher than the first level. For example, the first level is approximately 3.3V and the second level is approximately 6V~7V. In addition, the third level may be equal to the fourth level, such as 0V.

In another embodiment, the first level is higher than the second level and the fourth level is higher than the third level. In this case, the fourth level may be higher than the first level. For example, the first level is about 3.3V and the fourth level is about 6V~7V. Additionally, the second level may be equal to the third level, such as 0V.

In another embodiment, when the input signal IN1 is at a fifth level (e.g. a high level), the output signal OUT1 is at a sixth level (e.g. a low level). When the input signal IN1 is at a seventh level (e.g. another low level), the output signal OUT1 is at an eighth level (e.g. another high level). In this case, the eighth level is higher than the fifth level. For example, the fifth level is about 3.3V and the eighth level is about 6V~7V. Furthermore, the sixth level may be equal to the seventh level, such as 0V.

The core circuit 120 is coupled between the power terminals PW1 and PW2 and receives the output signal OUT1. In one embodiment, the core circuit 120 is a non-volatile memory (NVM), but the disclosure is not limited thereto. In other embodiments, the core circuit 120 may be another memory circuit. Generally, the core circuit 120 comprises a plurality of elements. For brevity, only the elements related to the invention are shown in FIG. 1A and the load 122 represent the other elements in the core circuit 120.

As shown in FIG. 1A, the core circuit 120 at least comprises a switch 121. In this embodiment, the switch 121 is coupled between the power terminal PW1 and the load 122. The switch 122 determines whether to transmit the voltage of the power terminal PW1 to the load 122 according to the output signal OUT1. For example, when the output signal OUT1 is at a first state (e.g. a low level or a high level), the switch 121 transmits the voltage of the power terminal PW1 to the load 122. In this case, when the output signal OUT1 is at a second state (e.g. a high level or a low level), the switch 121 does not transmit the voltage of the power terminal PW1 to the load 122. In one embodiment, the switch 121 is a P-type transistor, but the disclosure is not limited thereto. In other embodiment, the switch 121 may be coupled between the power terminal PW2 and the load 122 and determines whether to transmit the voltage of the power terminal PW2 to the load 122 according to the output signal OUT1.

Since the signal generator circuit 110 generates the output signal OUT1 according to the input signal IN1, when the input signal IN1 is not ready to be transmitted to the signal generator circuit 110, the output signal OUT1 may be at a floating level. Therefore, because the output signal OUT1 is at an error level, the switch 121 may be turned on causing a false action to occur in the core circuit 120. Furthermore, while the switch 121 is turned on, if an electrostatic discharge (ESD) event occurs between the power terminals PW1 and PW2, an ESD current passes from the switch 121 to the core circuit 120, damaging the core circuit 120.

Therefore, in a not-ready mode, since the input signal IN1 has not reached a target level, the signal generator circuit 110 sets the level of the output signal OUT1 to a predetermined level so that the switch 121 is turned off. Therefore, the false action does not occur in the core circuit 120. In addition, in this mode, if an ESD event occurs between the power terminals PW1 and PW2, since the switch 121 is turned off, the ESD current does not pass into the core circuit 120.

In a ready mode, since the input signal IN1 has reached the target level, the signal generator circuit 110 generates the output signal OUT1 according to the input signal IN1. In this mode, since the power terminals PW1 and PW2 have received corresponding operation voltages (e.g. 6V and 0V). Therefore, the signal generator circuit 110 sets the high level of the output signal OUT1 so that it is equal to the voltage of the power terminal PW1 and sets the low level of the output signal OUT1 so that it is equal to the voltage of the power terminal PW2.

Figure 1B:
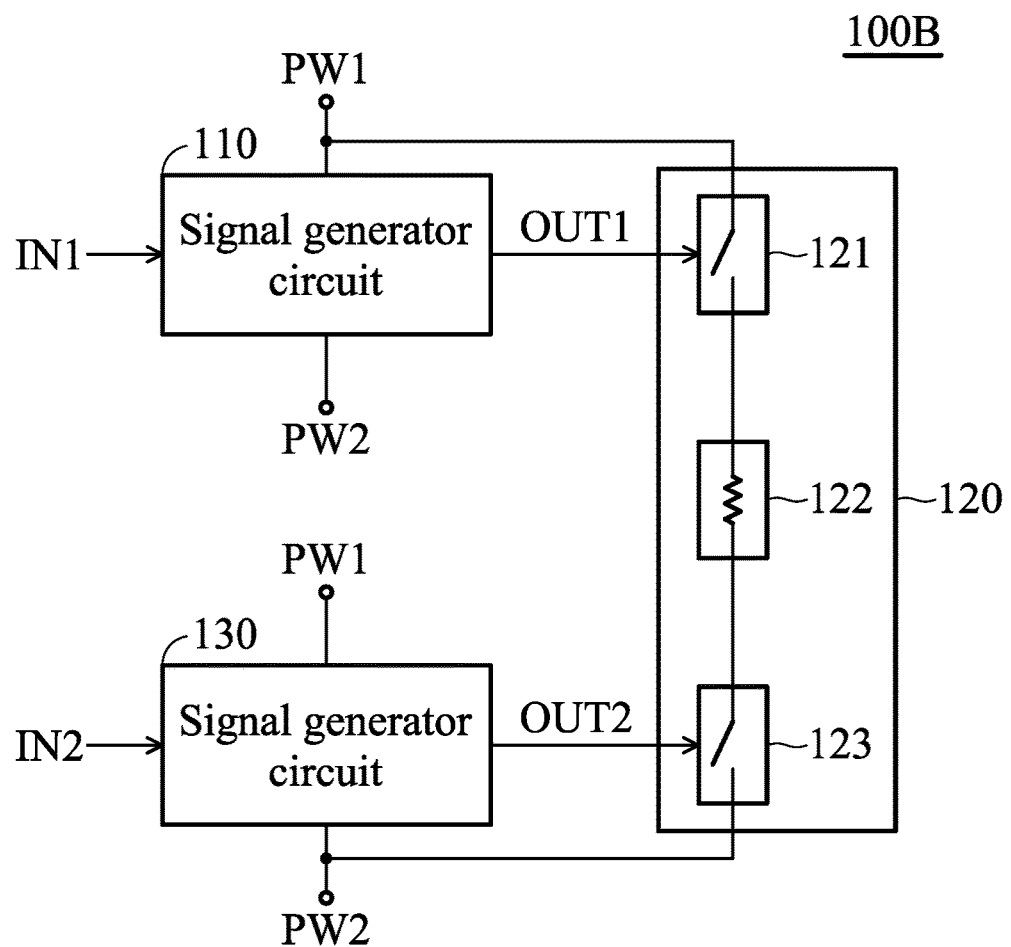
FIG. 1B is a schematic diagram of another exemplary embodiment of the anti-floating circuit according to various aspects of the present disclosure.

FIG. 1B is a schematic diagram of another exemplary embodiment of the anti-floating circuit according to various aspects of the present disclosure. FIG. 1B is similar to FIG. 1A except that the anti-floating circuit 100B shown in FIG. 1B further comprises a signal generator circuit 130. In this embodiment, the signal generator circuit 130 is also coupled between the power terminals PW1 and PW2 and generates an output signal OUT2 according to an input signal IN2. In one embodiment, the signal generator circuit 130 is a level shifter. In this case, the signal generator circuit 130 transforms the input signal IN2 to generate the output signal OUT2. In other embodiments, the input signal IN1 may be the same as or different from the input signal IN2. Since the operation of the signal generator circuit 130 is the same as the operation of the signal generator circuit 110, the description of the operation of the signal generator circuit 130 is omitted.

In this embodiment, the core circuit 120 further comprises a switch 123. The switch 123 is coupled to the load 122 in series and determines whether to transmit the voltage of the power terminal PW2 to the load 122 according to the output signal OUT2. For example, when the output signal OUT2 is at a first state, such as a low level or a high level, the switch 123 does not transmit the power of the power terminal PW2 to the load 122. In this case, when the output signal OUT2 is at a second state, such as a high level or a low level, the switch 123 transmits the voltage of the power terminal PW2 to the load 122. In one embodiment, the switch 123 is an N-type transistor, but the disclosure is not limited thereto. In other embodiments, the switch 123 is a P-type transistor.

In some embodiments, the kind of switch 121 and the kind of switch 123 are the same. For example, the switches 121 and 123 are P-type transistors or N-type transistors. In another embodiment, the kind of switch 121 is different from the kind of switch 123. For example, when the switch 121 is a P-type transistor, the switch 123 is an N-type transistor. When the switch 121 is an N-type transistor, the switch 123 is a P-type transistor. In other embodiments, when the switch 121 is turned on, the switch 123 is also turned on. When the switch 121 is turned off, the switch 123 is also turned off.

In a not-ready mode, since the input signals IN1 and IN2 has not reached the corresponding target levels, the signal generator circuit 110 sets the level of the output signal OUT1 to a first predetermined value and the signal generator circuit 130 sets the level of the output signal OUT2 to a second predetermined value so that the switches 121 and 123 are turned off. Since the switches 121 and 123 are turned off, a false action does not occur in the core circuit 120. Furthermore, since the switches 121 and 123 are turned off, an ESD current does not enter the core circuit 120.

When the input signal IN1 reaches a first target level and the input signal IN2 reaches a second target level, the signal generator circuits 110 and 130 operate in a ready mode. In this mode, the signal generator circuit 110 generates the output signal OUT1 according to the input signal IN1 to turn on or off the switch 122. Additionally, the signal generator circuit 130 generates the output signal OUT2 according to the input signal IN2 to turn on or off the switch 123. Since the signal generator circuits 110 and 130 generate the accurate output signals OUT1 and OUT2, the false action does not occur in the core circuit 120.

Figure 2A:
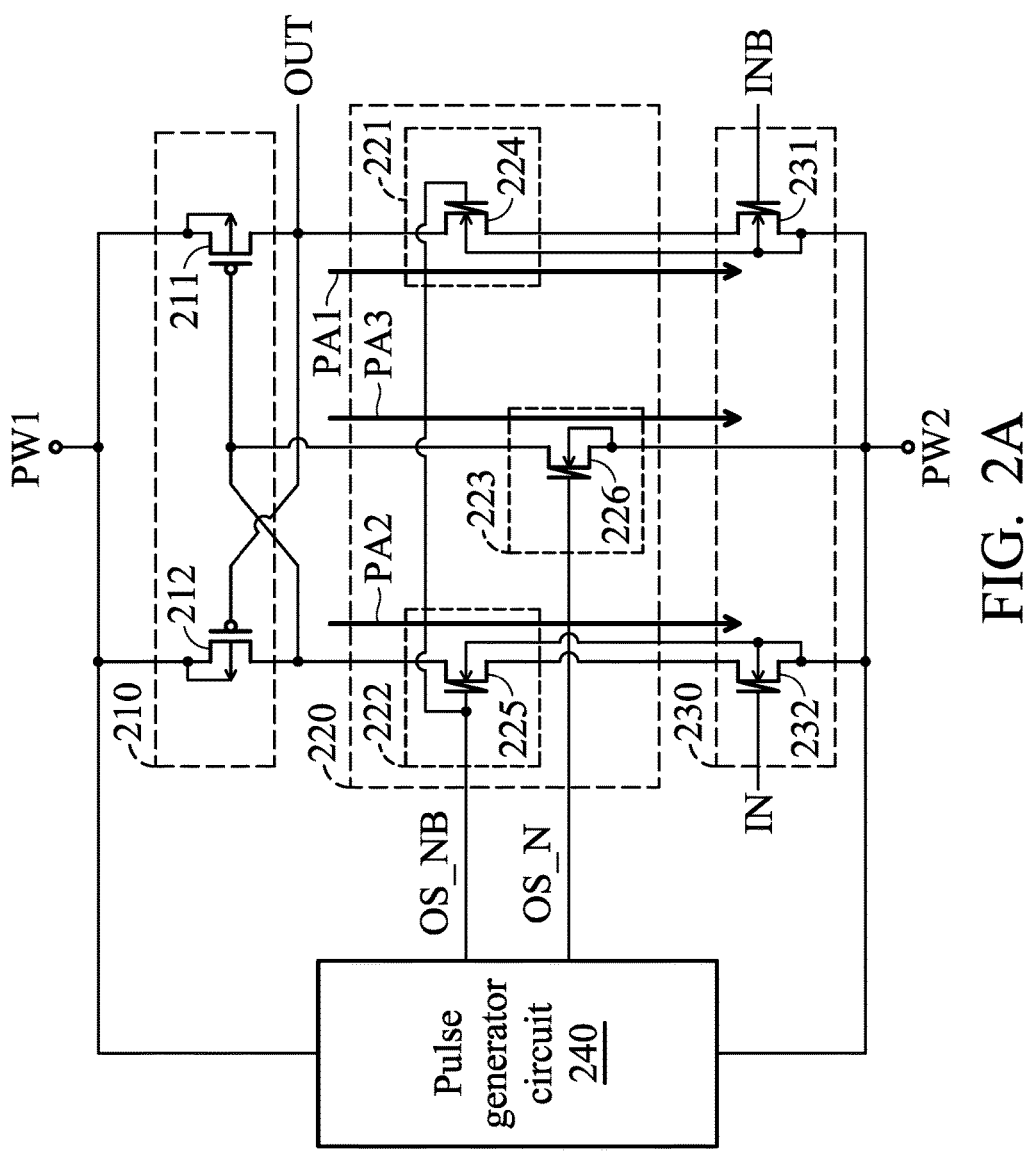
FIG. 2A is a schematic diagram of an exemplary embodiment of a signal generator circuit according to various aspects of the present disclosure.

FIG. 2A is a schematic diagram of an exemplary embodiment of a signal generator circuit according to various aspects of the present disclosure. The signal generator circuit 200A comprises a pull-high circuit 210, a control circuit 220 and a pull-low circuit 230. The pull-high circuit 210 comprises P-type transistors 211 and 212. The source of the P-type transistor 211 is coupled to the power terminal PW1. The drain of the P-type transistor 212 is coupled to the gate of the P-type transistor 211 and the control circuit 220. The gate of the P-type transistor 212 is coupled to the drain of the P-type transistor 211. In one embodiment, when the signal generator circuit 200A serves as the signal generator circuit 110 or 130 shown in FIG. 1B, the output signal OUT shown in FIG. 2A serves as the output signal OUT1 or OUT2.

The pull-low circuit 230 comprises N-type transistors 231 and 232. The gate of the N-type transistor 231 receives an inverted signal INB. The source of the N-type transistor 231 is coupled to the power terminal PW2. The drain of the N-type transistor 231 is coupled to the control circuit 220. The gate of the N-type transistor 232 receives the input signal IN. The source of the N-type transistor 232 is coupled to the power terminal PW2. The drain of the N-type transistor 232 is coupled to the control circuit 220. In this embodiment, the inverted signal INB is an inversion signal of the input signal IN.

In one embodiment, when the signal generator circuit 200A serves as the signal generator circuit 110 or 130 shown in FIG. 1B, the input signal IN shown in FIG. 2A serves as the input signal IN1 or IN2. In other embodiments, the signal generator circuit 200A further comprises an inverter (not shown), which inverts the input signal IN to generate the inverted signal INB. In some embodiments, the inverter is disposed outside of the signal generator circuit 200A.

The control circuit 220 is coupled between the pull-high circuit 210 and the pull-low circuit 230. In a ready mode (e.g. the input signal IN is ready), the control circuit 220 turns on a path PA1 between the P-type transistor 211 and the N-type transistor 231 and a path PA2 between the P-type transistor 212 and the N-type transistor 232. At this time, the control circuit 220 turns off a path PA3 between the P-type transistor 211 and the power terminal PW2. In this mode, the signal generator circuit 200A generates the output signal OUT according to the input signal IN.

When the input signal IN has not reached a target level or the input signal IN has not entered the signal generator circuit 200A yet, the signal generator circuit 200A operates in a not-ready mode. In the not-ready mode, the control circuit 220 turns off the paths PA1 and PA2 and turns on the path PA3. In this mode, the control circuit 220 sets the level of the output signal OUT to a predetermined value to turn off the switch (e.g. the switch 121 shown in FIG. 1A) disposed in the core circuit to avoid a false action occurring in the core circuit.

In this embodiment, the control circuit 220 comprises control elements 221~223. The control element 221 is coupled between the drain of the P-type transistor 211 and the drain of the N-type transistor 231. The control element 221 turns on or off the path PA1 according to a pulse signal OS_NB. In a ready mode (i.e. the input signal IN is ready), the pulse signal OS_NB is at a first level. Therefore, the control element 221 turns on the path PA1. In a not-ready mode (i.e. the input signal IN is not ready), the pulse signal OS_NB is at a second level. Therefore, the control element 221 turns off the path PA1.

The kind of control element 221 is not limited in the present disclosure. In this embodiment, the control element 221 is an N-type transistor 224. The gate of the N-type transistor 224 receives the pulse signal OS_NB. The drain of the N-type transistor 224 is coupled to the drain of the P-type transistor 211. The source of the N-type transistor 224 is coupled to the drain of the N-type transistor 231. In the ready mode, the pulse signal OS_NB is at a high level so that the N-type transistor 224 is turned on. Therefore, the path PA1 is turned on. In the not-ready mode, the pulse signal OS_NB is at a low level so that the N-type transistor 224 is turned off. Therefore, the path PA1 is turned off. In other embodiments, the control element 221 is a P-type transistor.

The control element 222 is coupled between the drain of the P-type transistor 212 and the drain of the N-type transistor 232. The control element 222 controls the path PA2 according to the pulse signal OS_NB. In the ready mode (e.g. the input signal IN has reached a target level), the pulse signal OS_NB is at a first level. Therefore, the control element 222 turns on the path PA2. In the not-ready mode (e.g. the input signal IN has not reached the target level), the pulse signal OS_NB is at a second level. Therefore, the control element 222 does not turn on the path PA2.

The kind of control element 222 is not limited in the present disclosure. In this embodiment, the control element 222 is an N-type transistor 225. The gate of the N-type transistor 225 receives the pulse signal OS_NB. The drain of the N-type transistor 225 is coupled to the drain of the P-type transistor 212. The source of the N-type transistor 225 is coupled to the drain of the N-type transistor 232. In the ready mode, the pulse signal OS_NB is at a high level so that the N-type transistor 225 is turned on. Therefore, the path PA2 is turned on. In the not-ready mode, the pulse signal OS_NB is at a low level so that the N-type transistor 225 is turned off. Therefore, the path PA2 does not be turned on. In some embodiments, the control element is a P-type transistor.

The control element 223 is coupled between the gate of the P-type transistor 211 and the power terminal PW2. The control element 223 turns on or off the path PA3 between the P-type transistor 211 and the power terminal PW2 according to the pulse signal OS_N. In a not-ready mode, the pulse signal OS_N is at a third level. Therefore, the control element 223 turns on the path PA3. In a ready mode, the pulse signal OS_N is at a fourth level. Therefore, the control element does not turn on the path PA3.

The invention does not limit the kind of the control element 223. In this embodiment, the control element 223 is an N-type transistor 226. The gate of the N-type transistor 226 receives the pulse signal OS_N. The drain of the N-type transistor 226 is coupled to the gate of the P-type transistor 211. The source of the N-type transistor 226 is coupled to the power terminal PW2. In the ready mode, the pulse signal OS_N is at a low level so that the N-type transistor 226 is turned off. Therefore, the path PA3 is turned off. In the not-ready mode, since the pulse signal OS_N is at a high level, the N-type transistor 226 is turned on. Therefore, the path PA3 is turned on. In some embodiments, the control element 223 is a P-type transistor.

In one embodiment, the pulse signal OS_N is opposite to the pulse signal OS_NB, but the disclosure is not limited thereto. When the control elements 221 and 222 are N-type transistors and the control element 223 is a P-type transistor, the pulse generator circuit 240 generates a single pulse signal to control the control elements 221~223. In another embodiment, when the control elements 221 and 222 are P-type transistors and the control element 223 is an N-type transistor, the pulse generator circuit 240 only generate a pulse signal to control the control elements 221~223.

In this embodiment, the pulse signals OS_NB and OS_N are generated by the pulse generator circuit 240. The pulse generator circuit 240 is coupled between the power terminals PW1 and PW2. The pulse generator circuit 240 generates the pulse signals OS_NB and OS_N according to the voltages of the power terminals PW1 and PW2. In some embodiments, different pulse generator circuits may generate different pulse signals.

Taking FIG. 1B as an example, the number of pulse signal generated by the pulse generator circuit of the signal generator circuit 110 may be the same as or different from the number of pulse signal generated by the pulse generator circuit of the signal generator circuit 130. Additionally, at least one of the pulse signals generated by the pulse generator circuit of the signal generator circuit 110 may be the same as or different from at least one of the pulse signal generated by the pulse generator circuit of the signal generator circuit 130. The operating configuration of the pulse generator circuit 240 is described in greater detail with reference to FIGS. 3A and 3B.

Figure 2B:
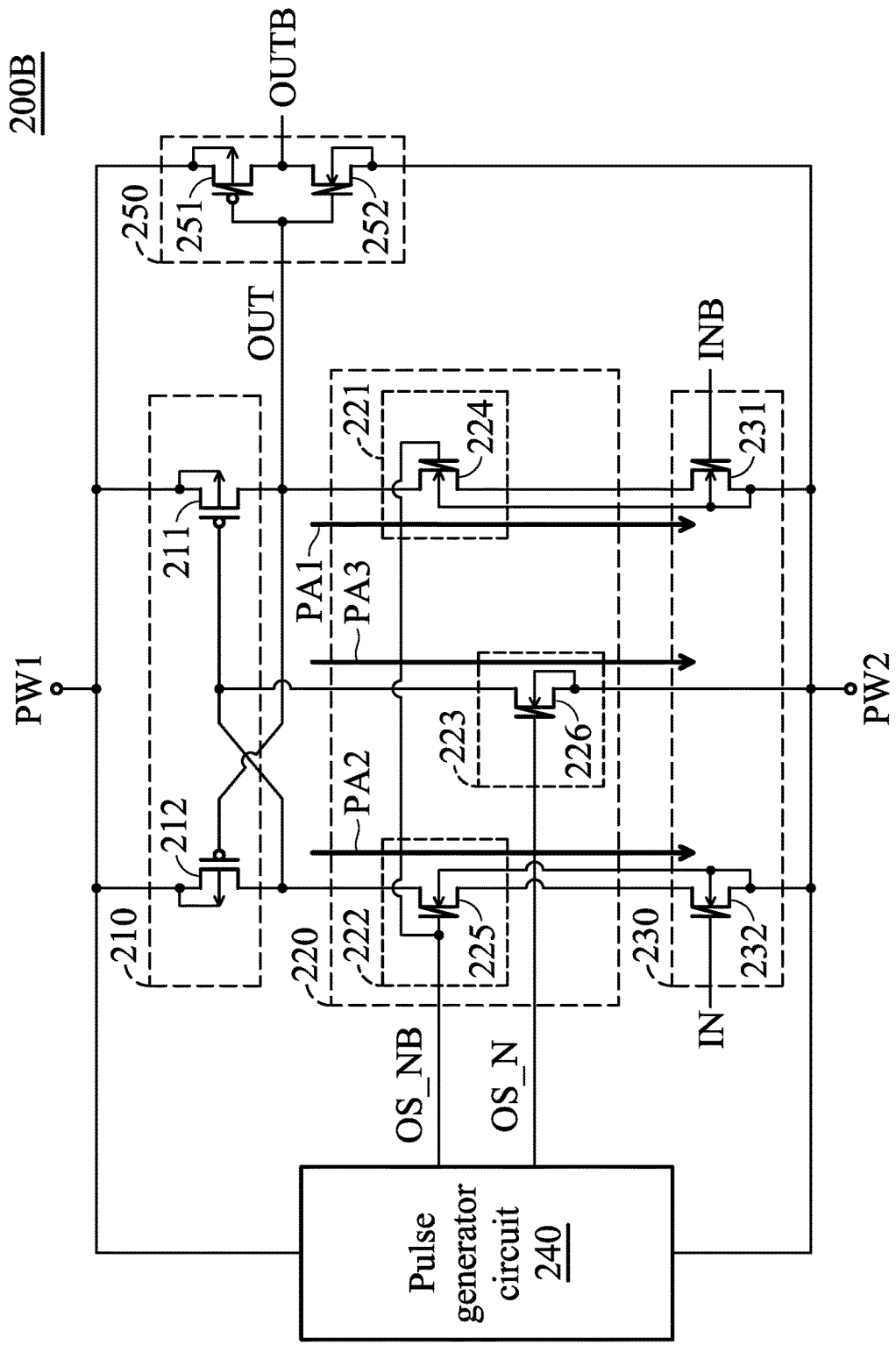
FIG. 2B is a schematic diagram of another exemplary embodiment of the signal generator circuit according to various aspects of the present disclosure.

FIG. 2B is a schematic diagram of another exemplary embodiment of the signal generator circuit according to various aspects of the present disclosure. FIG. 2B is similar to FIG. 2A except that the signal generator circuit 200B shown in FIG. 2B further comprises an inverter 250. The inverter 250 is coupled between the power terminals PW1 and PW2. The input terminal of the inverter 250 is coupled to the drain of the P-type transistor 211 to receive the output signal OUT. The output terminal of the inverter 250 is configured to provide the output signal OUTB. In one embodiment, the output signal OUTB is capable of serving as the output signal OUT1 or OUT2 in FIG. 1B.

In this embodiment, the inverter 250 comprises a P-type transistor 251 and an N-type transistor 252. The source of the P-type transistor 251 is coupled to the power terminal PW1. The gate of the P-type transistor 251 is coupled to the drain of the P-type transistor 211. The drain of the P-type transistor 251 provides the output signal OUTB. The gate of the N-type transistor 252 is coupled to the drain of the P-type transistor 211. The drain of the N-type transistor 252 is coupled to the drain of the P-type transistor 251. The source of the N-type transistor 252 is coupled to the power terminal PW2.

Figure 3A:
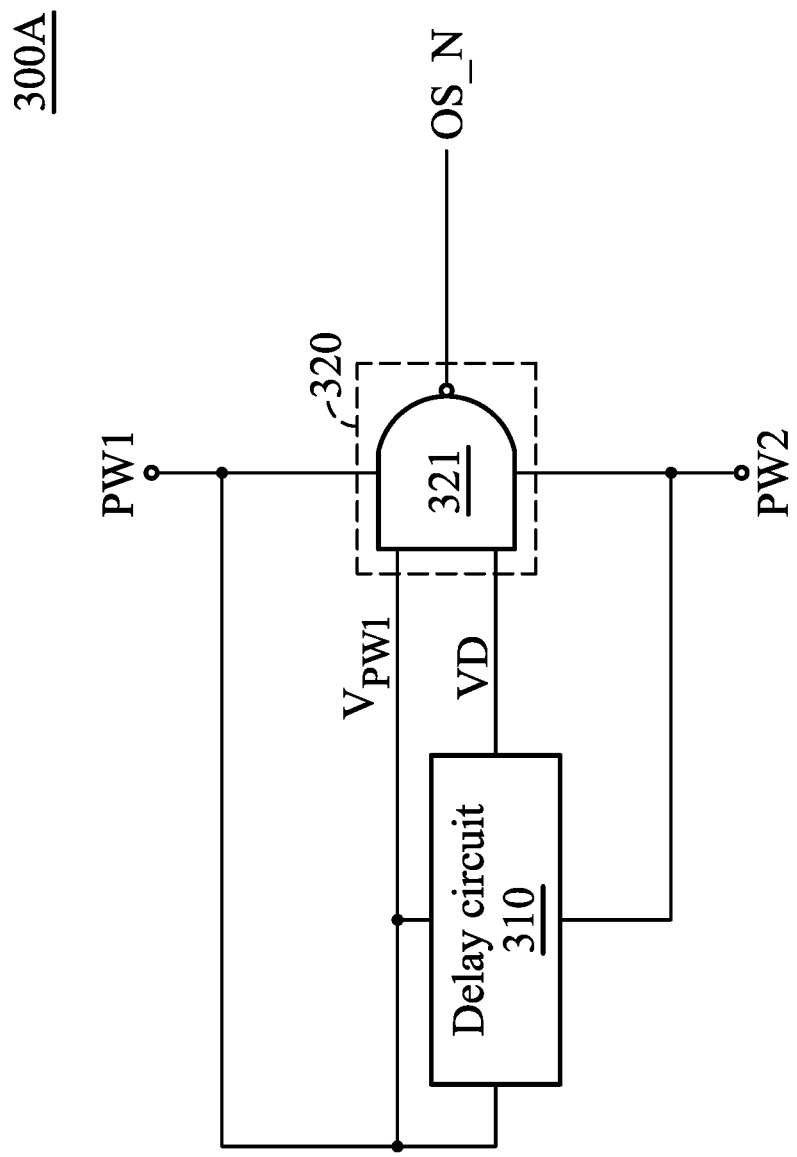
FIG. 3A is a schematic diagram of an exemplary embodiment of a pulse generator circuit according to various aspects of the present disclosure.

FIG. 3A is a schematic diagram of an exemplary embodiment of a pulse generator circuit according to various aspects of the present disclosure. The pulse generator circuit 300A comprises a delay circuit 310 and a logic circuit 320. The delay circuit 310 and the logic circuit 320 are coupled between the power terminals PW1 and PW2. The voltages of the power terminals PW1 and PW2 are served as the operation voltages of the delay circuit 310 and the logic circuit 320.

The delay circuit 310 delays the voltage of the power terminal PW1 to generate a delay signal VD. The logic circuit 320 generates the pulse signal OS_N according to the level $V_{PW1}$ of the power terminal PW1 and the delay signal VD. In this embodiment, when the level $V_{PW1}$ of the power terminal PW1 and the delay signal VD are at high levels, the pulse signal OS_N is at a low level. When one of the level $V_{PW1}$ of the power terminal PW1 and the delay signal VD is at a low level, the pulse signal OS_N is at a high level.

In one embodiment, the logic circuit 320 is a NAND gate 321. One input terminal of the NAND gate 321 receives the level $V_{PW1}$ of the power terminal PW1. Another input terminal of the NAND gate 321 receives the delay signal VD. The output terminal of the NAND gate 321 provides the pulse signal OS_N. In other embodiments, other circuit structure can serve as the logic circuit 320.

Taking FIG. 2A as an example, assume that the control elements 221 and 222 are N-type transistors and the control element 223 is a P-type transistor. In this case, the pulse generator circuit 300A provides the pulse signal OS_N to the gates of the control elements 221~223. In a ready mode, the pulse signal OS_N is at a high level to turn on the control elements 221 and 222 and turn off the control element 223. Therefore, the paths PA1 and PA2 are turned on and the path PA3 is turned off. At this time, the signal generator circuit 200A generates the output signal OUT according to the input signal IN. In a not-ready mode, the pulse signal OS_N is at a low level to turn off the control elements 221 and 222 and turn on the control element 223. Therefore, the paths PA1 and PA2 are turned off and the path PA3 is turned on. At this time, the signal generator circuit 200A sets the output signal OUT to a predetermined level to turn off the switch 121 of the core circuit 120, avoiding a false action in the core circuit 120 and avoiding an ESD current entering the core circuit 120. In other embodiments, when the control elements 221 and 222 are P-type transistors and the control element 223 is an N-type transistor, the pulse generator circuit 240 only generates a single pulse signal to control the control elements 221~223 simultaneously.

Figure 3B:
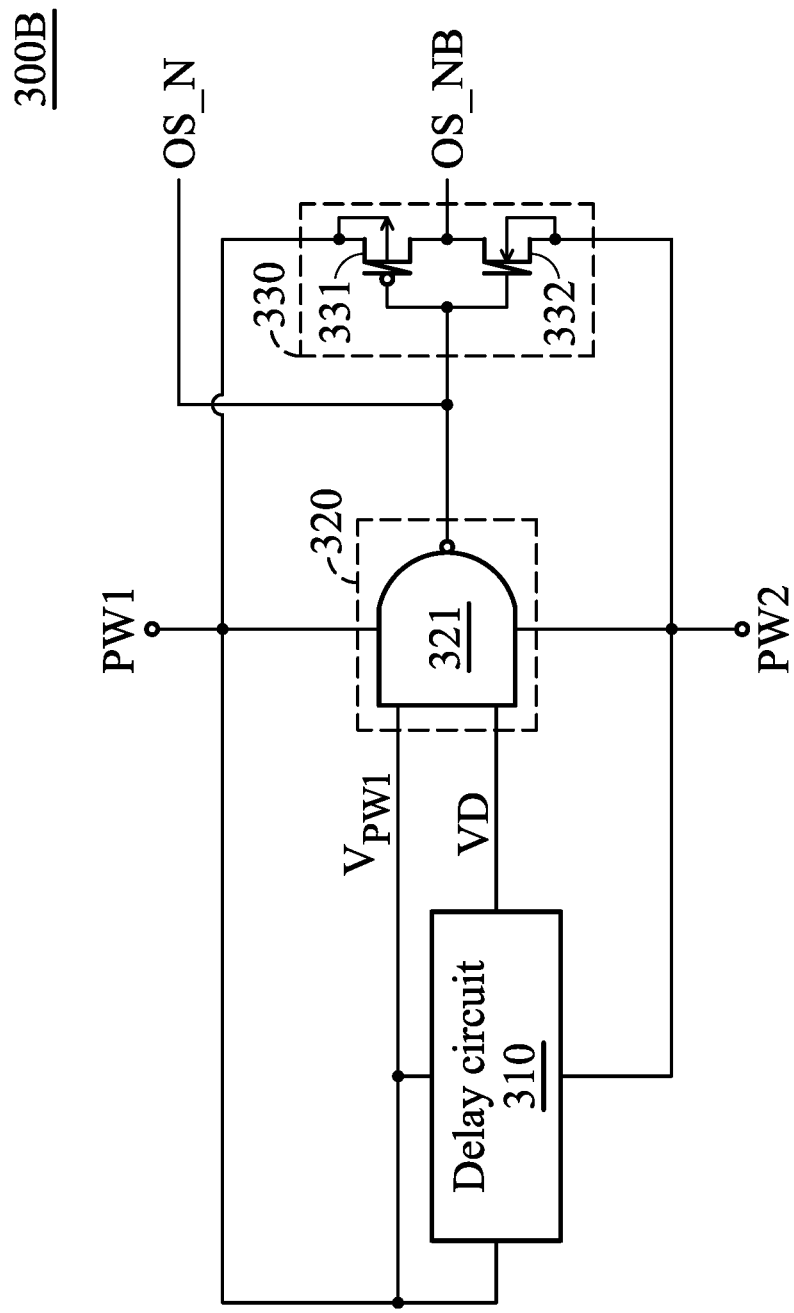
FIG. 3B is a schematic diagram of another exemplary embodiment of the pulse generator circuit according to various aspects of the present disclosure.

FIG. 3B is a schematic diagram of another exemplary embodiment of the pulse generator circuit according to various aspects of the present disclosure. FIG. 3B is similar to FIG. 3A except that the pulse generator circuit 300B of FIG. 3B further comprises an inverter 330. The inverter 330 inverts the pulse signal OS_N to generate the pulse signal OS_NB. Taking FIG. 2A as an example, the pulse signal OS_N is at a high level and the pulse signal OS_NB is at a low level in a not-ready mode. Therefore, the paths PA1 and PA2 are turned off and the path PA3 is turned on. In this mode, the signal generator circuit 200A sets the level of the output signal OUT to a predetermined value. In a ready mode, the pulse signal OS_N is at a low level and the pulse signal OS_NB is at a high level. Therefore, the paths PA1 and PA2 are turned on and the path PA3 is turned off. In this mode, the signal generator circuit 200A generates the output signal OUT according to the input signal IN.

Figure 4:
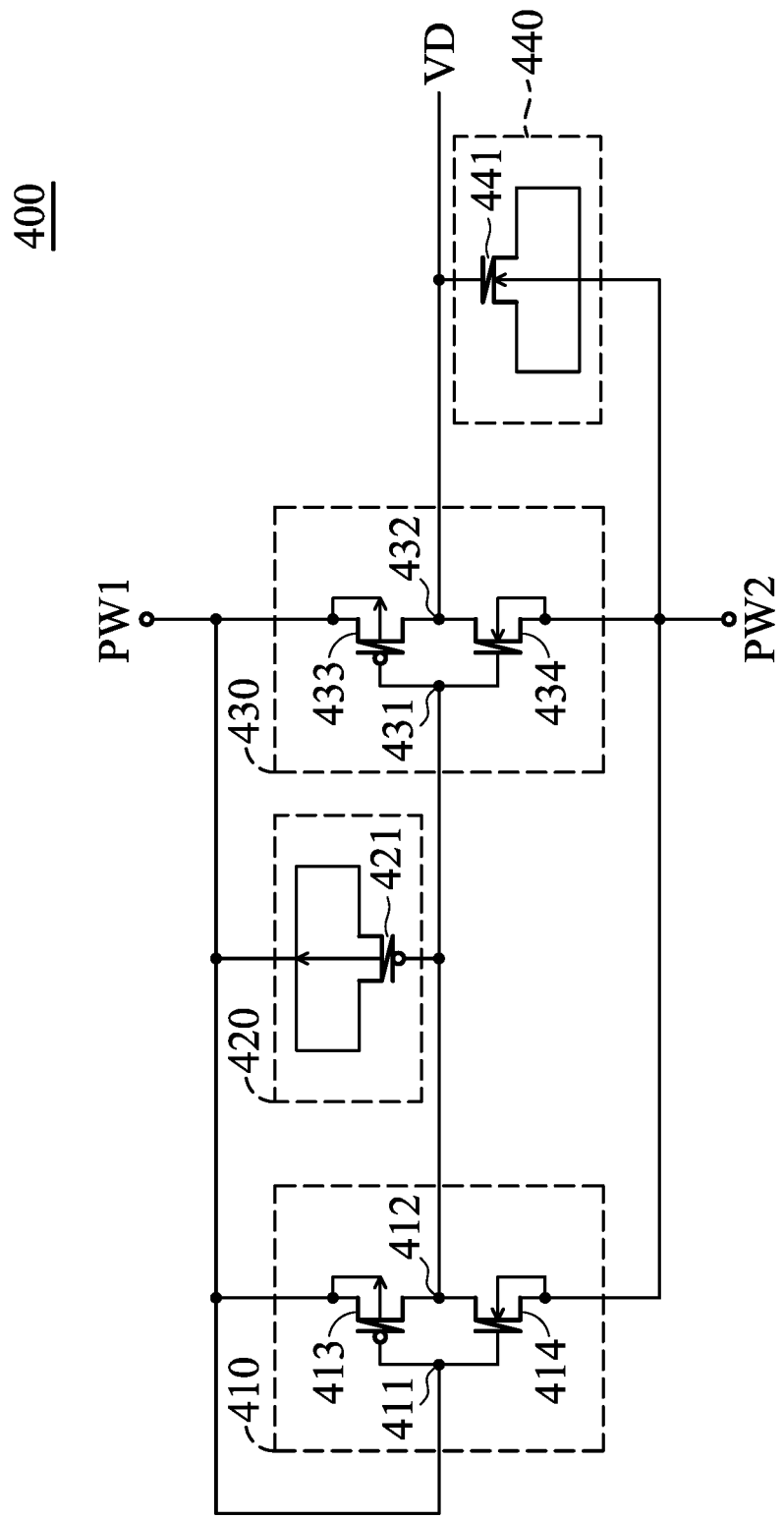
FIG. 4 is a schematic diagram of an exemplary embodiment of a delay circuit according to various aspects of the present disclosure.

FIG. 4 is a schematic diagram of an exemplary embodiment of a delay circuit according to various aspects of the present disclosure. The delay circuit 400 comprises inverters 410 and 430 and capacitors 420 and 440. The number of inverters is not limited in the present disclosure. In one embodiment, the delay circuit 400 comprises even inverters.

In this embodiment, the inverter 410 is coupled between the power terminals PW1 and PW2 and comprises an input terminal 411 and an output terminal 412. The input terminal 411 is coupled to the power terminal PW1. In one embodiment, the inverter 410 comprises a P-type transistor 413 and an N-type transistor 414. The gate of the P-type transistor 413 is coupled to the input terminal 411. The source of the P-type transistor 413 is coupled to the power terminal PW1. The drain of the P-type transistor 413 is coupled to the output terminal 412. The gate of the N-type transistor 414 is coupled to the input terminal 411. The source of the N-type transistor 414 is coupled to the power terminal PW2. The drain of the N-type transistor 414 is coupled to the output terminal 412.

The capacitor 420 is coupled between the power terminal PW1 and the output terminal 412. In this embodiment, the capacitor 420 is a P-type transistor 421. The gate of the P-type transistor 421 is coupled to the output terminal 421. The drain and the source of the P-type transistor 421 are coupled to the power terminal PW1.

The inverter 430 is coupled between the power terminals PW1 and PW2 and comprises an input terminal 431 and an output terminal 432. The input terminal 431 is coupled to the output terminal 412. The output terminal 432 is configured to provide the delay signal VD. In one embodiment, the inverter 430 comprises a P-type transistor 433 and an N-type transistor 434. The gate of the P-type transistor 433 is coupled to the input terminal 431. The source of the P-type transistor 433 is coupled to the power terminal PW1. The drain of the P-type transistor 433 is coupled to the output terminal 432. The gate of the N-type transistor 434 is coupled to the input terminal 431. The source of the N-type transistor 434 is coupled to the power terminal PW2. The drain of the N-type transistor 434 is coupled to the output terminal 432.

The capacitor 440 is coupled between the power terminal PW2 and the output terminal 432. In this embodiment, the capacitor 440 is an N-type transistor 441. The gate of the N-type transistor 441 is coupled to the output terminal 432. The drain and the source of the N-type transistor 441 are coupled to the power terminal PW2.

Figure 5:
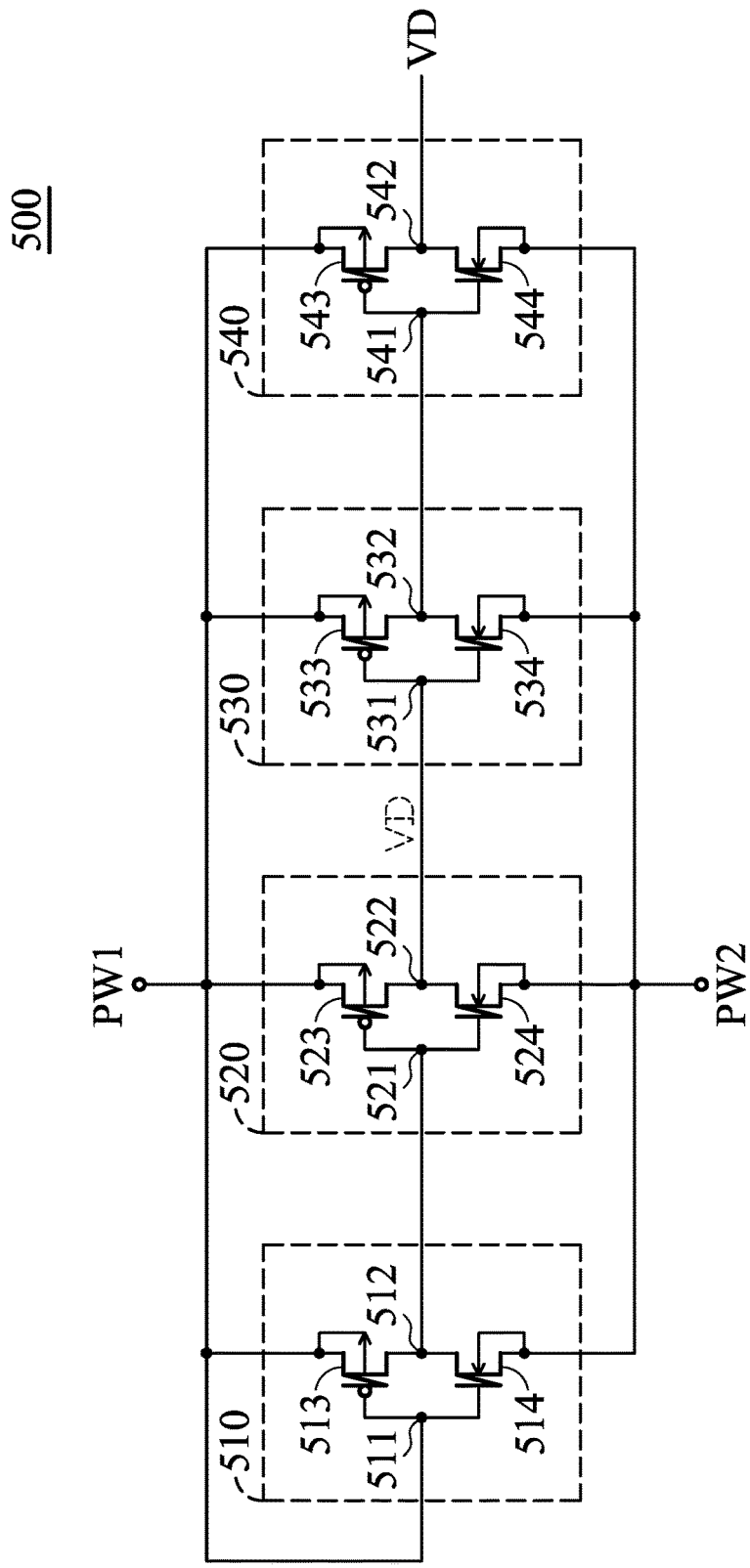
FIG. 5 is a schematic diagram of another exemplary embodiment of the delay circuit according to various aspects of the present disclosure.

FIG. 5 is a schematic diagram of another exemplary embodiment of the delay circuit according to various aspects of the present disclosure. The delay circuit 500 at least comprises inverters 510 and 520. The inverter 510 is coupled between the power terminals PW1 and PW2 and comprises an input terminal 511 and an output terminal 512.

The input terminal 511 is coupled to the power terminal PW1. In one embodiment, the inverter 510 comprises a P-type transistor 513 and an N-type transistor 514. The gate of the P-type transistor 513 is coupled to the input terminal 511. The source of the P-type transistor 513 is coupled to the power terminal PW1. The drain of the P-type transistor 513 is coupled to the output terminal 512. The gate of the N-type transistor 514 is coupled to the input terminal 511. The source of the N-type transistor 514 is coupled to the power terminal PW2. The drain of the N-type transistor 514 is coupled to the output terminal 512.

The inverter 520 is coupled between the power terminals PW1 and PW2 and comprises an input terminal 521 and an output terminal 522. The input terminal 521 is coupled to the output terminal 512. In one embodiment, the inverter 520 comprises a P-type transistor 523 and an N-type transistor 524. The gate of the P-type transistor 523 is coupled to the input terminal 521. The source of the P-type transistor 523 is coupled to the power terminal PW1. The drain of the P-type transistor 523 is coupled to the output terminal 522. The gate of the N-type transistor 524 is coupled to the input terminal 521. The source of the N-type transistor 524 is coupled to the power terminal PW2. The drain of the N-type transistor 524 is coupled to the output terminal 522. In one embodiment, when the delay circuit 500 only comprises the inverters 510 and 520, the output terminal 522 is configured to provide the delay signal VD.

In other embodiments, the delay circuit 500 further comprises inverters 530 and 540. The inverter 530 is coupled between the power terminals PW1 and PW2 and comprises an input terminal 531 and an output terminal 532. The input terminal 531 is coupled to the output terminal 522. In one embodiment, the inverter 530 comprises a P-type transistor 533 and an N-type transistor 534. The gate of the P-type transistor 533 is coupled to the input terminal 531. The source of the P-type transistor 533 is coupled to the power terminal PW1. The drain of the P-type transistor 533 is coupled to the output terminal 532. The gate of the N-type transistor 534 is coupled to the output terminal 531. The source of the N-type transistor 534 is coupled to the power terminal PW2. The drain of the N-type transistor 534 is coupled to the output terminal 532.

The inverter 540 is coupled between the power terminals PW1 and PW2 and comprises an input terminal 541 and an output terminal 542. The input terminal 541 is coupled to the output terminal 532. In one embodiment, the inverter 540 comprises a P-type transistor 543 and an N-type transistor 544. The gate of the P-type transistor 543 is coupled to the input terminal 541. The source of the P-type transistor 543 is coupled to the power terminal PW1. The drain of the P-type transistor 543 is coupled to the output terminal 542. The gate of the N-type transistor 544 is coupled to the input terminal 541. The source of the N-type transistor 544 is coupled to the power terminal PW2. The drain of the N-type transistor 544 is coupled to the output terminal 542 to provide the delay signal VD. The number of inverters is not limited in the present disclosure. In one embodiment, the delay circuit 500 comprises even inverters.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An anti-floating circuit generating a first output signal according to a first input signal in a first mode and setting the first output signal to a first predetermined value in a second mode, comprising:
    a first pull-high circuit comprising:
        a first P-type transistor comprising a source coupled to a first power terminal and a drain outputting the first output signal; and
        a second P-type transistor comprising a source coupled to the first power terminal, a drain coupled to a gate of the first P-type transistor and a gate coupled to the drain of the first P-type transistor;
    a first pull-low circuit comprising:
        a first N-type transistor comprising a gate receiving a first inverted signal and a source coupled to a second power terminal; and
        a second N-type transistor comprising a gate receiving the first input signal and a source coupled to the second power terminal; and
    a first control circuit coupled between the first pull-high circuit and the first pull-low circuit,
    wherein in the first mode, the first control circuit turns on a first path between the first P-type transistor and the first N-type transistor and a second path between the second P-type transistor and the second N-type transistor and turns off a third path between the first P-type transistor and the second power terminal, and
    wherein in the second mode, the first control circuit turns off the first and second paths and turns on the third path.

2. The anti-floating circuit as claimed in claim 1, wherein in the first mode, when the first input signal is at a first level, the first output signal is at a second level, and when the first input signal is at a third level, the first output signal is at a fourth level, and wherein the first level is lower than the second level, and the third level is equal to the fourth level.

3. The anti-floating circuit as claimed in claim 1, wherein in the first mode, when the first input signal is at a first level, the first output signal is at a second level, and when the first input signal is at a third level, the first output signal is at a fourth level, and wherein the first level is lower than the fourth level and second level is equal to the third level.

4. The anti-floating circuit as claimed in claim 1, wherein the first input signal is opposite to the first inverted signal.

5. The anti-floating circuit as claimed in claim 1, wherein the first control circuit comprises:
    a first control element coupled between the first P-type transistor and the first N-type transistor;
    a second control element coupled between the second P-type transistor and the second N-type transistor; and
    a third control element coupled between the first P-type transistor and the second power terminal,
    wherein in the first mode, the first control element turns on the first path according to a first pulse signal, the second control element turns on the second path according to the first pulse signal, and the third control element turns off the third path according to a second pulse signal, wherein in the second mode, the first control element turns off the first path according to the first pulse signal, the second control element turns off the second path according to the first pulse signal and the third control element turns on the third path according to the second pulse signal.

6. The anti-floating circuit as claimed in claim 5, wherein the first control element is a third N-type transistor, the second control element is a fourth N-type transistor and the third control element is a fifth N-type transistor.

7. The anti-floating circuit as claimed in claim 6,
wherein the third N-type transistor comprises a drain coupled to the drain of the first P-type transistor, a source coupled to the drain of the first N-type transistor and a gate receiving the first pulse signal,
wherein the fourth N-type transistor comprises a source coupled to the drain of the second N-type transistor and a gate receiving the first pulse signal, and
wherein the fifth N-type transistor comprises a drain coupled to the gate of the first P-type transistor, a source coupled to the second power terminal and a gate receiving the second pulse signal.

8. The anti-floating circuit as claimed in claim 5, further comprising:
a pulse generator circuit configured to generate the first and second pulse signals, wherein the first pulse signal is opposite to the second pulse signal.

9. The anti-floating circuit as claimed in claim 8, wherein the pulse generator circuit comprises:
a delay circuit coupled to the first power terminal to generate a delay signal; and
a logic circuit generating the second pulse signal according to a voltage level of the first power terminal and the delay signal.

10. The anti-floating circuit as claimed in claim 9, wherein the delay circuit comprises:
a first inverter coupled between the first and second power terminals and comprising a first input terminal and a first output terminal, wherein the first input terminal is coupled to the first power terminal;
a first capacitor coupled between the first power terminal and the first output terminal;
a second inverter coupled between the first and second power terminals and comprising a second input terminal and a second output terminal, wherein the second input terminal is coupled to the first output terminal, and the second output terminal is coupled to the logic circuit; and
a second capacitor coupled between the second output terminal and the second power terminal.

11. The anti-floating circuit as claimed in claim 10, wherein the first capacitor is a third P-type transistor and the second capacitor is a third N-type transistor.

12. The anti-floating circuit as claimed in claim 11, wherein a gate of the third P-type transistor is coupled to the first output terminal, a drain and a source of the third P-type transistor are coupled to the first power terminal, a gate of the third N-type transistor is coupled to the second output terminal and a drain and a source of the third N-type transistor are coupled to the second power terminal.

13. The anti-floating circuit as claimed in claim 9, wherein the delay circuit comprises:
a first inverter coupled between the first and second power terminal and comprising a first input terminal and a first output terminal, wherein the first input terminal is coupled to the first power terminal; and
a second inverter coupled between the first and second power terminals and comprising a second input terminal and a second output terminal, wherein the second input terminal is coupled to the first output terminal and the second output terminal is coupled to the logic circuit.

14. The anti-floating circuit as claimed in claim 9, wherein the logic circuit is a NAND gate.

15. The anti-floating circuit as claimed in claim 9, wherein the pulse generator circuit further comprises:
an inverter circuit inverting the second pulse signal to generate the first pulse signal.

16. The anti-floating circuit as claimed in claim 1, further comprising:
a core circuit coupled between the first and second power terminals; and
a switch transmitting a voltage of the first power terminal or a voltage of the second power terminal to the core circuit according to the first output signal.

17. The anti-floating circuit as claimed in claim 1, further comprising:
an inverter inverting the first output signal to generate a second output signal;
a core circuit coupled between the first and second power terminals; and
a switch transmitting a voltage of the first power terminal or a voltage of the second power terminal to the core circuit according to the second output signal.

18. The anti-floating circuit as claimed in claim 1, further comprising:
a second pull-high circuit comprising:
a third P-type transistor comprising a source coupled to the first power terminal and a drain outputting a second output signal; and
a fourth P-type transistor comprising a source coupled to the first power terminal, a drain coupled to a gate of the third P-type transistor and a gate coupled to the drain of the third P-type transistor;
a second pull-low circuit comprising:
a third N-type transistor comprising a gate receiving a second inverted signal and a source coupled to the second power terminal; and
a fourth N-type transistor comprising a gate receiving a second input signal and a source coupled to the second power terminal; and
a second control circuit coupled between the second pull-high circuit and the second pull-low circuit,
wherein in the first mode, the second control circuit turns on a fourth path between the third P-type transistor and the third N-type transistor and a fifth path between the fourth P-type transistor and the fourth N-type transistor and turns off a sixth path between the third P-type transistor and the second power terminal, and
wherein in the second mode, the second control circuit turns off the fourth and fifth paths and turns on the sixth path.

19. The anti-floating circuit as claimed in claim 18, wherein the second control circuit comprises:
a first control element coupled between the third P-type transistor and the third N-type transistor;
a second control element coupled between the fourth P-type transistor and the fourth N-type transistor; and
a third control element coupled between the third P-type transistor and the second power terminal, wherein in the first mode, the first control element turns on the fourth path according to a third pulse signal, the second control element turns on the fifth path according to the third pulse signal, and the third control element turns off the sixth path according to a fourth pulse signal, and wherein in the second mode, the first control element turns off the fourth path according to the third pulse signal, the second control element turns off the fifth path according to the third pulse signal, and the third control element turns on the sixth path according to the fourth pulse signal.

20. The anti-floating circuit as claimed in claim 19, further comprising:
- a core circuit coupled between the first and second power terminals;
- a first switch transmitting a voltage of the first power terminal to the core circuit according to the first output signal; and
- a second switch transmitting a voltage of the second power terminal to the core circuit according to the second output signal.

* * * * *